_US009443561B1_

United States Patent
Roberts et al.

(10) Patent No.: US 9,443,561 B1
(45) Date of Patent: Sep. 13, 2016

(54) RING NETWORKS FOR INTRA- AND INTER-MEMORY I/O INCLUDING 3D-STACKED MEMORIES

(71) Applicant: Advanced Micro Devices, Inc., Sunnyvale, CA (US)

(72) Inventors: David Roberts, Sunnyvale, CA (US); Yasuko Eckert, Sunnyvale, CA (US); Mitesh Meswani, Sunnyvale, CA (US); Indrani Paul, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/719,200

(22) Filed: May 21, 2015

(51) Int. Cl.
| | |
|---|---|
| *G11C 5/02* | (2006.01) |
| *H04L 12/933* | (2013.01) |
| *G06F 13/42* | (2006.01) |
| *G11C 5/06* | (2006.01) |
| *G06F 13/40* | (2006.01) |

(52) U.S. Cl.
CPC .............. *G11C 5/02* (2013.01); *G06F 13/4027* (2013.01); *G06F 13/4068* (2013.01); *G06F 13/42* (2013.01); *G11C 5/06* (2013.01); *H04L 49/102* (2013.01)

(58) Field of Classification Search
CPC ....... G11C 5/02; G11C 5/06; G06F 13/4068; G06F 13/4027; G06F 13/42; H04L 49/102
USPC .............................................. 365/51, 52, 244
See application file for complete search history.

(56) References Cited

U.S. PATENT DOCUMENTS

| | | | | |
|---|---|---|---|---|
| 5,122,984 | A * | 6/1992 | Strehler | G06F 17/30982 365/230.03 |
| 6,658,509 | B1 * | 12/2003 | Bonella | G06F 13/4243 370/223 |
| 8,139,390 | B2 * | 3/2012 | Oh | G11C 7/02 365/147 |
| 8,572,423 | B1 * | 10/2013 | Isachar | G06F 1/3225 365/244 |
| 2004/0148482 | A1 * | 7/2004 | Grundy | G06F 12/06 711/167 |

OTHER PUBLICATIONS

Chris Fallin et al., "A High-Performance Hierachical Ring On-Chip Interconnect with Low-Cost Routers", SAFARI Technical Report No. 2011-007, Sep. 6, 2011, pp. 1-21.

* cited by examiner

*Primary Examiner* — Tha-O H Bui
(74) *Attorney, Agent, or Firm* — Staniford Tomita LLP

(57) ABSTRACT

Embodiments are described for a communications interconnect scheme for 3D stacked memory devices. A ring network design is used for networks of memory chips organized as individual devices with multiple dies or wafers. The design comprises a three-tier ring network where each ring serves a different set of memory blocks. One ring or set of rings interconnects memory within a die (inter-bank), a second ring or set of rings interconnects memory across die in a stack (inter-die), and the third ring or set of rings interconnects memory across stacks or chip packages (inter-stack).

20 Claims, 4 Drawing Sheets

RING NETWORKS FOR INTRA- AND INTER-MEMORY I/O INCLUDING 3D-STACKED MEMORIES

TECHNICAL FIELD

Embodiments relate generally to microprocessor memory design, and more specifically to improved multi-memory interconnect schemes.

BACKGROUND

A network-on-chip (NoC) is a communication subsystem on an integrated circuit (IC), such as between logic cores in a system-on-chip. NoC technology applies networking methods to on-chip communication and provides improvements over conventional bus and crossbar interconnections. In an NoC system, modules such as processor core and memories exchange data using a point-to-point data link sub-system that allows messages to be relayed from any source module to any destination module over several links using routing decisions at intermediate switches. NoC systems and similar VLSI-based chips have typically utilized mesh network architectures in which each node relays data for the network. Ring networks generally provide lower-power alternatives to mesh networks for on-chip communication, reducing the need for complex buffering and routing.

To achieve higher densities, multiple die stacking techniques have been developed to allow large modules to be manufactured using cheaper low density wafers. Three-dimensional (3D) stacked memory modules typically contain two or more RAM chips stacked on top of each other and use through-silicon vias (TSV) or other vertical electrical connections passing completely through wafer to interconnect the stacks. A new memory interconnect standard, called the Hybrid Memory Cube (HMC) specification defines an inter-chip communication protocol whereby certain I/O channels on the chip interconnect can communicate with other networked memory stacks. However, current multi-3D-stack memory network standards such as HMC use predefined, dedicated I/O links for pass-through traffic routed to networked memory stacks. This wastes I/O bandwidth when those channels are idle. Networks-on-chip also use complex, energy-hungry routers with buffering in order to achieve flexible communication.

It would be advantageous to provide a memory interconnect architecture based on ring principles that can be more energy efficient than NoC topologies and more bandwidth-efficient than pass-through channel routing (as per the HMC specification). When applied within die-stacked devices, a ring interconnect maximizes internal data transfer bandwidth on a shared bus, facilitating inter-die memory transfers simultaneous with external data transfers, for example, multiplying available bandwidth. Also, because the through-silicon vias (TSVs) in 3D die stacks can carry significant current and have low resistance, they may possibly be clocked faster than off-device interconnects, allowing for a high-frequency common ring for inter-die interconnects.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY OF EMBODIMENTS

Embodiments are described for a system having a first three-dimensional integrated circuit device having a first plurality of die layers arranged in a stacked die configuration, a first set of ring networks disposed within a die layer of the first plurality of die layers and a second set of ring networks disposed between die layers of the first plurality of die layers, a second three-dimensional integrated circuit device having a second plurality of die layers arranged in a stacked die configuration, and a third set of ring networks coupling at least one of the first or second set of ring networks to at least one of the second plurality of die layers. In the system, the second three-dimensional integrated circuit comprises respective sets of ring networks disposed within and between each layer of the second plurality of die layers. Separate die layers of the first plurality of die layers and the second plurality of die layers may be connected to one another within each respective integrated circuit device through one of through-silicon vias, capacitive coupling, or conductive links. In an embodiment, each of the first, second and third set of ring networks utilizes a same ring-based data transmission protocol. The transmission protocol may be one of a token ring protocol, a token packet protocol, or a proprietary protocol. The first three-dimensional integrated circuit device and second three-dimensional integrated circuit device may both comprise stacked memory devices, and the stacked memory device may be hybrid memory cube, WideIO or High Bandwidth Memory (HBM) devices, where WideIO and HBM are JEDEC 3D memory standards. In an embodiment, at least one of the first and second sets of ring networks comprises pairs of rings transmitting data in opposite directions. The system may further include a set of inter-die bridge routers coupling at least one of the first set of ring networks to at least one of the second set of ring networks, and a set of inter-device bridge routers coupling at least one ring network of the first set or second set of ring networks to at least one ring network of the second three-dimensional integrated through at least one ring network of the third set of ring networks.

Embodiments are further directed to a system having a first stacked die integrated circuit (IC) having multiple die layers and an intra-layer ring network arranged horizontally on a layer and an inter-layer ring network arranged vertically between at least two of the die layers, a second stacked die IC having multiple die layers and a respective intra-layer ring network arranged horizontally on a layer of the second stacked die IC and a respective inter-layer ring network arranged vertically between at least two die layers of the second stacked die IC, and a transmission link coupling at least one ring network of the first stacked die IC to at least one respective ring network of the second stacked die IC to form an inter-device ring network. At least one ring network of the first stacked die IC and the at least one respective ring network of the second stacked die IC, and the inter-device ring network employs the same data transmission protocol. The transmission protocol may be a token ring protocol, a token packet protocol, or a proprietary protocol.

Embodiments are yet further directed to a method of interconnecting nodes among three-dimensional integrated circuits (IC), by providing a set of horizontal ring networks along respective die layers of each three-dimensional IC, providing a set of vertical ring networks between die layers of each three-dimensional IC, and providing at least one system ring network coupling a horizontal ring network of the set of horizontal ring networks to a vertical ring network of the set of vertical ring networks. Each node of the interconnected nodes comprises a router configured to pass network traffic among the three-dimensional ICs. The network traffic may be transmitted according to a transmission protocol comprising one of a token ring protocol, a token packet protocol, or a proprietary protocol. The three-dimensional ICs may comprise hybrid memory cube or other 3D-stacked memory devices, and the nodes may comprise memory locations within respective ICs. In an embodiment, the method further comprises providing an interface to facilitate definition and reconfiguration of the horizontal and vertical ring networks through one or more software routines. The method may further comprise providing a bridge router component within the at least one system ring network to transmit network traffic between at least one of the set of horizontal ring networks and at least one of the set of vertical ring networks.

BRIEF DESCRIPTION OF THE DRAWINGS

In the following drawings like reference numbers are used to refer to like elements. Although the following figures depict various examples, the one or more implementations are not limited to the examples depicted in the figures.

DETAILED DESCRIPTION

Embodiments are described for a communications interconnect scheme for 3D stacked memory devices or other stacked devices, such as logic chips. A ring network design is used for networks of memory chips organized as individual devices with multiple dies or wafers. The design comprises a three-tier ring network where each ring serves a different set of memory blocks. One ring or set of rings interconnects memory within a die (inter-bank), a second ring or set of rings interconnects memory across die in a stack (inter-die), and the third ring or set of rings interconnects memory across stacks or chip packages (inter-stack). This interconnect architecture provides a scalable multi-dimensional network that expands advanced 3D chip designs such as the hybrid memory cube (HMC), WideIO or HBM and makes total I/O bandwidth available for traffic to any memory device in the system, without dedicating limited bandwidth to each one, or requiring complex, power-hungry NoC router blocks with buffering. WideIO and HBM are both JEDEC 3D memory standards.

Figure 1:
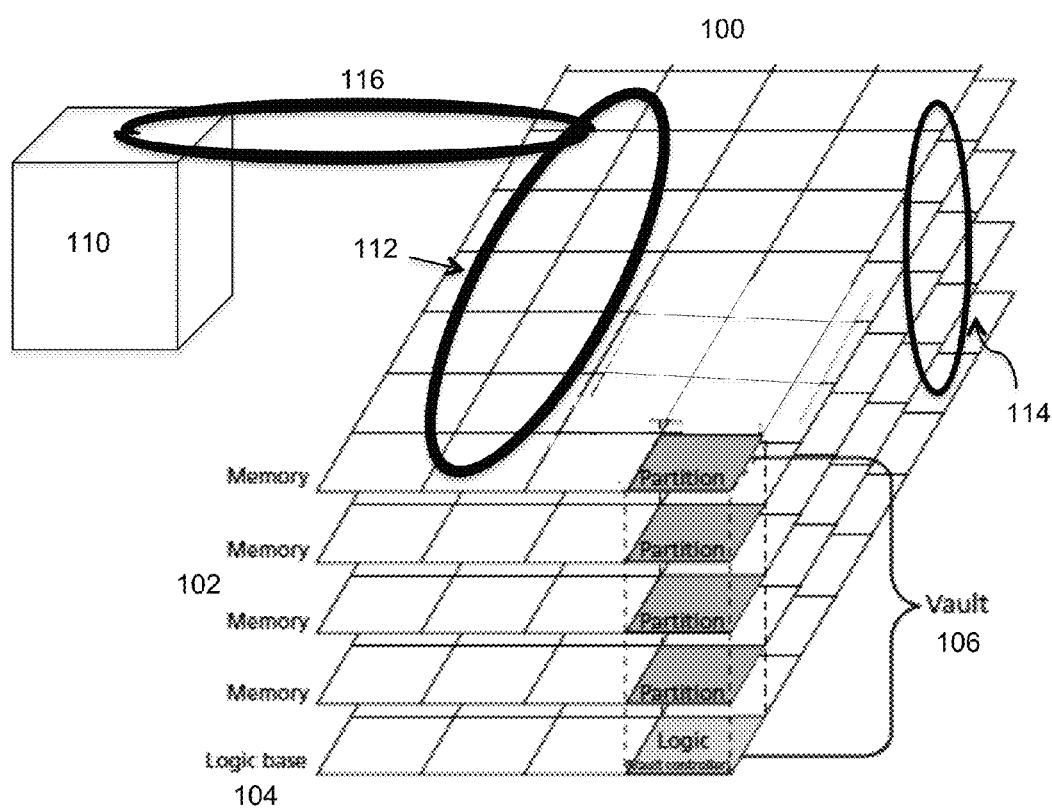
FIG. 1 illustrates a 3D-stacked memory device that implements a multi-tier communications interconnect scheme, under some embodiments.

Embodiments are directed to providing multi-tier ring networks within and between 3D-stacked logic dies, such as HMC or similar devices. FIG. 1 illustrates a 3D-stacked memory device that implements a multi-tier communications interconnect scheme, under some embodiments. Device 100 consists of a single package containing multiple memory die 102 and one logic base 104, stacked together, using through-silicon via (TSV) technology. The memory is organized into vaults (or channels) 106 that are functionally and operationally independent. Each channel may have a memory controller in the logic base that manages all memory reference operations within that channel. In the case of HMC, the logic base 104 manages multiple functions, and all HMC I/O, implemented as multiple serialized, full duplex links. There is memory control for each channel comprising data routing and buffering between I/O links and channels. All in-band communication across a link is packetized, where packets specify single, complete operations. Commands and data are transmitted in both directions across the link using a packet-based protocol where the packets consist of 128-bit flow that are serialized, transmitted across the physical lanes of the link, and then re-assembled at the receiving end of the link. A physical layer handles serialization, transmission, and deserialization of the data; a link layer provides the low-level handling of the packets at each end of the link; and a transaction layer provides the definition of the packets, the fields within the packets, and the packet verification and retry functions of the link. Two logical blocks exist within the link layer and transaction layer: the link master, which is the logical source of the link where the packets are generated and the transmission of the data bits is initiated; and the link slave, which is the logical destination of the link where the data bits of the packets are received, parsed, evaluated, and then forwarded internally.

For the embodiment of FIG. 1, the memory device 100 is part of a system that includes one or more other like memory devices 110. The memory interconnections within and between the devices comprise ring networks. Three ring networks are shown in FIG. 1, thus producing a three-tier interconnection scheme. Ring network 112 connects memory cells within a single die or wafer of device 100, and is referred to as an intra-die, inter-bank, or horizontal ring. Ring network 114 connects memory cells among different dies of the device 100, and is referred to as an inter-die or vertical ring. Ring 116 connects memory cells between two different devices 100 and 110, and is referred to as an inter-device, inter-stack or system ring. Any number of ring networks of the various different types may be included in the system depending on system requirements and constraints. In an embodiment, each of the ring networks in a system employs the same data transmission protocol. In an alternative embodiment, different ring types may employ different ring protocols, such as vertical and horizontal ring networks employing a first type of protocol and system rings employing a second type of protocol.

Though the example of FIG. 1 illustrates a stacked memory device with four memory die layers, it should be noted that any practical number of memory dies may be used. The device topography and data transmission protocol represents one example of a 3D-stacked logic device that may be used in conjunction with embodiments, and other similar 3D-stacked devices may be used. In addition, although embodiments are described with respect to memory devices, i.e., 3D devices in which data is transmitted among memory cells or locations, embodiments of a multi-tier ring architecture may be used with any type of stacked die device, such as processors, co-processors, communications devices, and the like. With respect to memory devices, embodiments are applicable to any 3D-stacked memories composed of homogeneous or heterogeneous memory types (e.g., DRAM and NVRAM).

Figure 2:
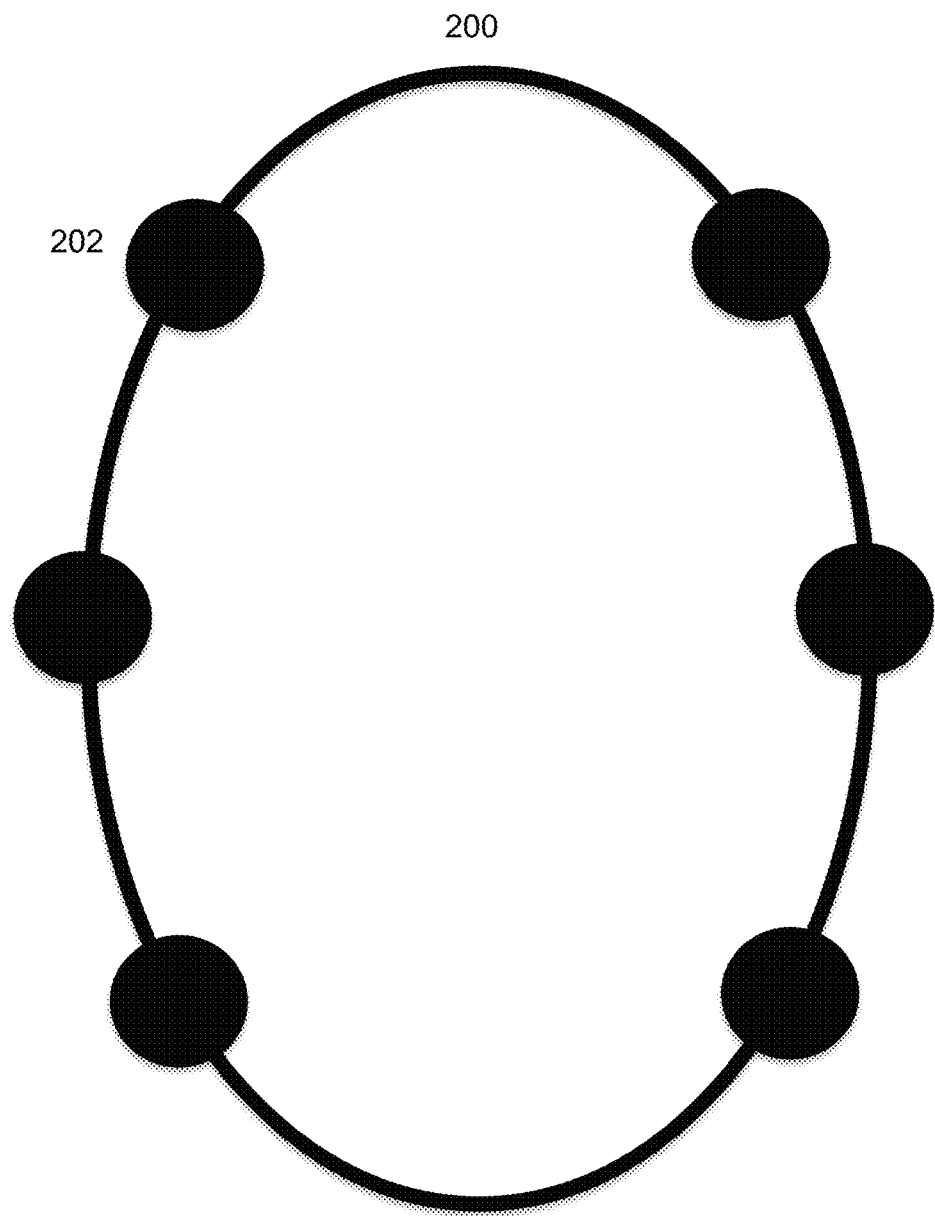
FIG. 2 illustrates an example ring network that is used in a multi-tier interconnection scheme, under some embodiments.

FIG. 2 illustrates an example ring network that is used in a multi-tier interconnection scheme, under some embodiments. As shown in FIG. 2, ring network 200 is formed by a single continuous pathway in which each node 202 connects to exactly two other nodes. Data travels from node to node, with each node along the way handling every packet.

The ring 200 may be a single conductor coupling the nodes to one another or it can be a two (or more conductor) medium that provides redundancy in case of link failure, such as in a counter-rotating ring topography. The transmission media may be copper, fiber, or any appropriate conductive media, and any appropriate data transmission protocol may be used, such as Spatial Reuse Protocol, Fiber Distributed Data Interface (FDDI), Copper Distributed Data Interface (CDDI), Resilient Packet Ring, and token ring protocols.

The nodes 202 of ring network 200 comprises a processor (or processing unit), a memory location, or other network node. Each node may include a node router that acts to pass through circulating data traffic, and allows traffic to enter the ring and leave the ring when necessary. Each router may contain a pipeline register for the router stage and a separate pipeline stage for link traversal, though other configurations are also possible. When two or more rings are coupled to one another, such as a horizontal ring and a vertical or system ring, or two horizontal rings, etc., one or more bridge routers may be used. A bridge router connects a local ring to another ring (e.g., a global ring) and exchanges traffic between the rings. The size of a ring 200 is generally defined by the pre-determined bus width. In an embodiment, the ring networks may be of any appropriate width, such as 64, 128 or 256-bits wide. The ring networks of the system may all utilize rings of the same width, or different rings or types of rings may employ different size ring widths. For example, a system rings may be configured to be wider than horizontal or vertical rings.

As shown in FIG. 1, embodiments are directed to hierarchical rings for energy-efficient on-chip networks that are applied to 3D-stacked logic dies, such as the stacked memory device 100 of FIG. 1. The segments of a ring are isolated such that concurrent, independent data transfers can occur simultaneously on different ring segments. In an embodiment, multiple ring networks are implemented throughout a stacked device and between different devices. For multiple 3D devices, a 3-tier ring network is implemented where each ring serves a different set of memory blocks: (1) within an individual die (intra-die, inter-bank or horizontal rings), (2) across dies in a stack (inter-die or vertical rings), and (3) cross stacks or chip packages (inter-stack or inter-device rings). One or more of the rings may be main bus to which multiple other rings are connected to form a ring-based network.

Figure 3:
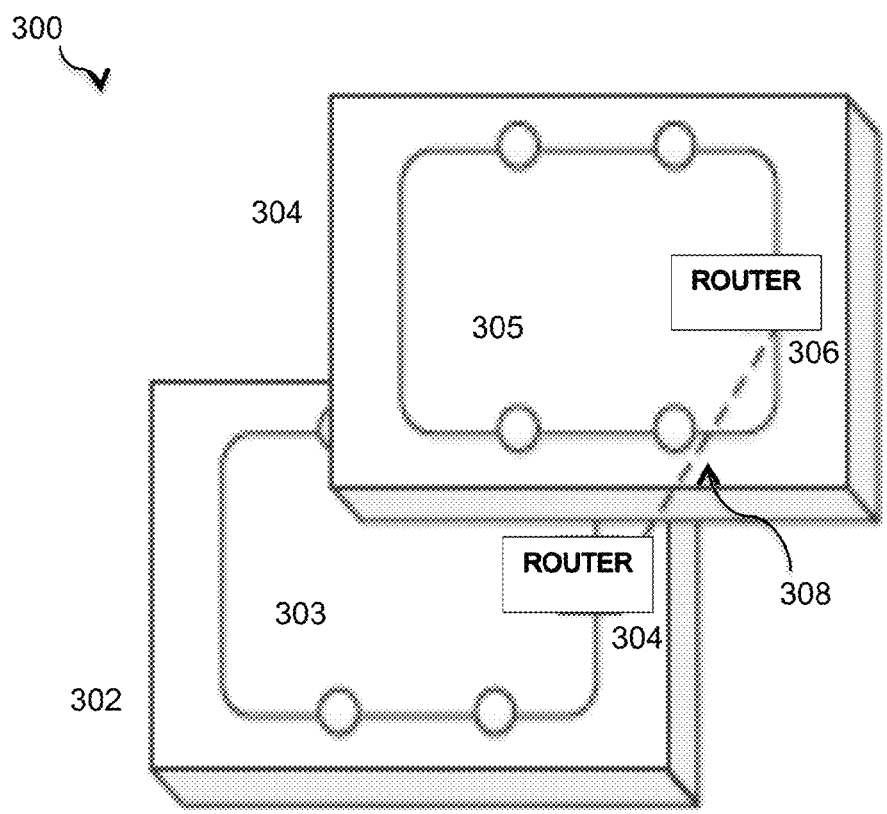
FIG. 3 illustrates an example two-die single-stack ring networks (intra- and inter-die rings), under an embodiment.

FIG. 3 illustrates an example two-die single-stack ring networks (tiers 1 and 2), under an embodiment. Device 300 is a simple two layer device with die layers 302 and 304. Each layer has at least one ring, 303 and 305. Thus, as shown in FIG. 3, within a die, the usual bus interface shared by memory banks is replaced by a ring. This generally helps reduce wiring area overhead, especially for high-latency memories that underutilize the bus. In the vertical direction 308 between the two die layers (e.g., across through-silicon vias) there is another ring, where the connecting nodes are a single router (bridge router) 304, 306 or switch on each die. Each ring facilitates concurrent inter-node communication along different segments of the network without occupying bandwidth on other segments, so that concurrent communication within the device can occur. For example, in a 4-die stack, adjacent pairs of die (volatile and non-volatile memories) can simultaneously checkpoint their state on a single ring.

The interconnection between the die layers 302 and 304 the device of FIG. 1 may be provided by any appropriate connection means, such as through-silicon vias (TSVs), capacitive coupling, inter-layer wire connections, conductive links, and any other appropriate connection means. In general, TSVs are a preferred means of connection since TSVs connecting stacked die potentially have lower resistance and capacitance than some other on- and off-die interconnect, and a higher frequency can be used for the inter-die ring to allow servicing of more banks on one ring.

Figure 4:
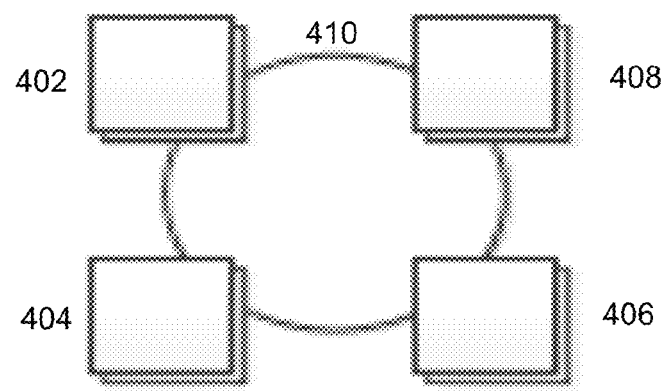
FIG. 4 is a top view of board-level memory ring network, under some embodiments.

FIG. 4 is a top view of board-level memory ring network, under some embodiments. In the board-level implementation, several different 3D devices are provided. Thus, as shown in FIG. 4, system 400 comprises individual 3D stacked devices 402-408. Each device 402-408 may be shown as a two-layer device, but any number of layers is possible. An inter-stack (or inter-device or system) ring 410 is formed by coupling additional bridge routers on each memory stack together in a ring topography. The bridge router may be included on any appropriate portion of each device, such as on a logic die. For small networks, this provides an efficient means of capacity expansion without the cost and complexity of a mesh network. Groups of rings and hierarchical rings can be arbitrarily connected with other types of network. When memory stacks include processing-in-memory (PIM) logic, the system software may attempt to localize data accesses, naturally reducing traffic on the outer rings.

FIGS. 3 and 4 illustrate the three optional ring network dimensions, under an embodiment. Simple router logic is required at each node to implement a ring bus protocol. The main benefit of replacing the shared buses with rings is a reduction in average wire length, energy reduction, and greater utilization of I/O channels in each dimension. Embodiments may include optional features such as: pairs of rings in opposite directions to reduce latency and add redundancy for greater reliability; bus repeaters for increased range; and pass-through paths using direct optical or electrical coupling to reduce latency for distant nodes (e.g., use two rings, each with every other node connected). In an embodiment, a hierarchy of ring bandwidths may be used for scalability and wire length reduction. For example, the ring architecture may comprise clusters around 'thin' ring centers, which connect to a faster central ring. The hierarchy could be designed under considerations of voltage island clusters. For example, all devices that touch a particular mini-ring belong to the same voltage domain. In addition, there may be a bidirectional ring to communicate across multiple voltage domains for synchronization.

Figure 5:
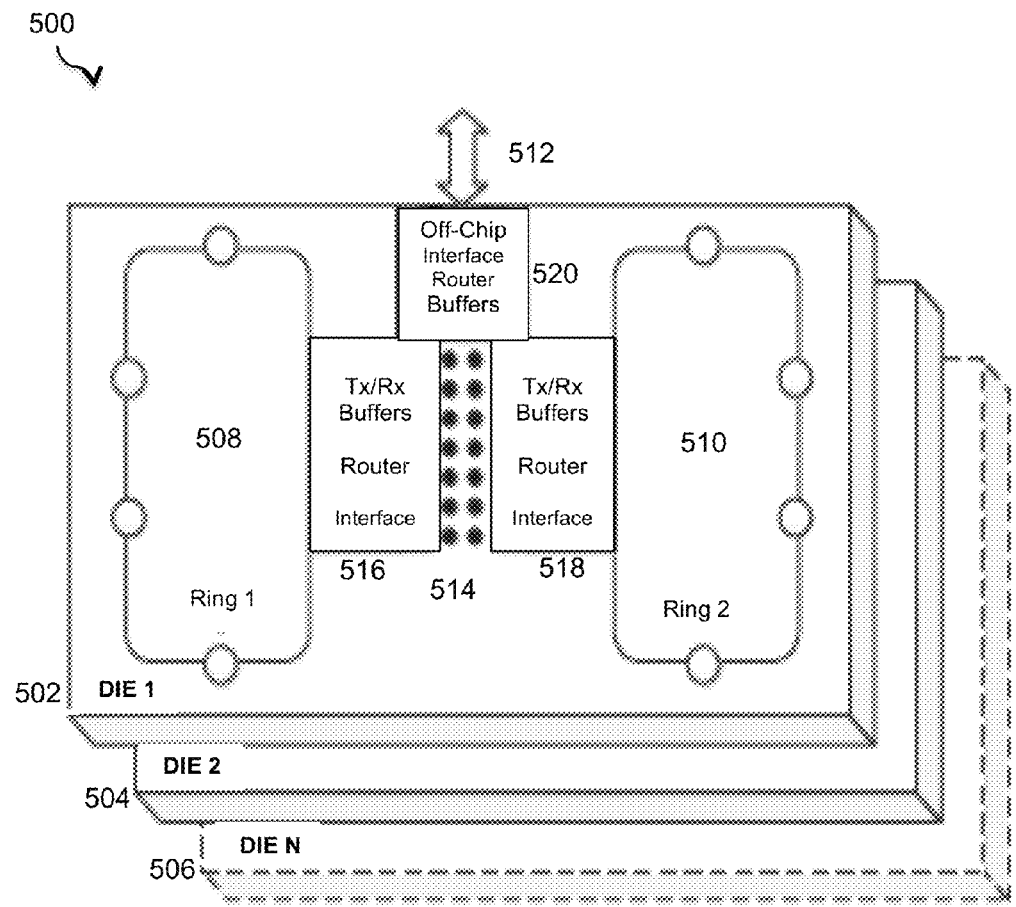
FIG. 5 illustrates certain interconnection components in a three-tier interconnection system, under some embodiments.

FIG. 5 illustrates certain interconnection components in a three-tier interconnection system, under some embodiments. As shown in FIG. 5, device 500 comprises a number of die layers 502-506 and denoted die 1 to die N, where N can be any practical number such as four to eight, or more. The die 1 layer 502 is shown as having two inter-bank (horizontal) ring networks 508 and 510 (denoted Ring 1 and Ring 2, respectively). A set of TSVs 514 are provided to support one or more inter-die (vertical) rings that connect nodes on one or more of the die layers 502-506 together. To communicate between rings, each ring may include a number of components that facilitate ring-to-ring data transfers. Thus, ring 508 includes a bridge router circuit 516 that includes a receive (RX) buffer, a transmit (TX) buffer and a switch or router to a TSV interface that couples to the TSVs 514. Likewise, ring 510 includes a bridge router circuit 518 that includes a receive (RX) buffer, a transmit (TX) buffer and a switch or router to a TSV interface that couples to the TSVs 514. For coupling to system or inter-device rings over a system link 512, the die 502 may also include a bridge router circuit 520 that includes transmit and receive buffers and an off-chip ring interface and switch or router.

For the system shown in FIG. 5, each of the dies 502-504 may represent identical functional circuits, such as all memory layers of the same capacity and configuration. Alternatively, the dies may contain different types of devices and may be of different sizes. For example, system 500 may include a single large die for processing and controller functions and multiple smaller dies for memory, or other similar disparate arrangements.

The example configuration of device 500 show that in general, it can be useful to keep the TSVs central in the die as the edges of the die may experience more stress while manufacturing. Thus, in a typical 3D device there could be one inter-die ring or two, with one on each side of the device. The components and circuit configuration of device 500 is provided for purposes of illustration with respect to one or more possible embodiments, and other circuit components and configurations are possible.

The number and configuration of rings within a device 500 is generally set during the manufacturing process. In an embodiment, rings may be defined and or reconfigured using appropriate software tools. One or more interface circuits or APIs (application program interfaces) may be provided to enable programmatic control over the configuration and arrangement of nodes within and among the die layers of the device. For example, a node registry or similar data structure could be used to define nodes and assign them to particular ring networks in the device.

Bus Communication Protocol

In an embodiment, the multi-tier ring network architecture employs a data transfer protocol compatible with the ring architecture in each tier. In general, the same protocol is used for all of the tiers to streamline the data transmission process. Thus, the intra-die, inter-die, and inter-stack rings all use the same data transfer protocol. Examples of suitable protocols include token ring, token packet, and other similar protocols including proprietary protocols.

In an embodiment, the multi-tier ring architecture uses a token ring protocol (e.g., IBM Token Ring, IEEE 802.5) to implement multiple token ring networks. Token Ring networks pass empty data frames around a ring of nodes until one node wants to transmit to another. The sender acquires to token, preventing transmission by other nodes while it holds it. The sender then sets the frame as occupied, specifies the destination address, and sends the data payload in that (and following) frames. The receiver, upon seeing frames addressed to it, releases the token, sets the frame state to empty, and consumes the data. In an alternative embodiment, the ring network may use a token-passing protocol Additional embodiments could allow for different components to specify token priorities and transmit timers to allow prioritization of memory accesses. One example use of priorities is for example when different memory types are connected to the same shared ring, such as NVRAM and DRAM. The memory controller could determine that the DRAM packets are more performance critical and assigns a high priority when it receives a token. Priority token may be implemented as follows, the first time a device receives a token it inserts its desired priority level. Subsequently all other devices receiving the empty token with priority check to see if they have higher priority packets if so they increase the priority level or pass the empty token forward. Upon receiving the empty token the second time the device will determine if it has a matching priority level, if so now it can transmit data. The priority can be used to allow device to hold onto a token and send continuous stream of packets for some period of time.

In alternative embodiments, each device attached to the token ring can also use specific transmit timers, which explicitly state the amount of time they wish to transmit data packets. Similar to the token priority implementation, the device has to first put the timer value and then wait for the next time to inspect the empty token to see if it has a matching timer value and proceed accordingly. These priority packets are not restricted to token rings connecting different memory types but can apply to any token ring.

In a separate embodiment, the token passed in the ring could indicate power demands of the request and the ring bandwidth that the process/task ID generating those requests may need. Depending on these power and bandwidth demand attributes, and the current state of the ring (such as current power consumption in the ring, current bandwidth access in the ring) a particular ring may decide to prioritize a request or stall it.

Any appropriate size and configuration may be used to define the token used by the ring networks. For example, a standard token ring implementation may reside at the data link layer (DLL) of the OSI model and use a three-byte frame as the token that travels around the ring. Tokens may consist of a start delimiter, an access control byte, and an end delimiter. Besides tokens, other data elements may include data/command frames that vary in size, depending on the size of the Information field. Data frames carry information for upper-layer protocols, while command frames contain control information and have no data for upper-layer protocols. The foregoing is meant to be illustrative of possible data transmission protocols and elements that may be used, and embodiments are not so limited.

Embodiments make total I/O bandwidth available for traffic to any memory device in system, without dedicating limited bandwidth to each one, or requiring complex, power-hungry NoC router blocks with buffering. It provides a low-power, scalable solution for high-bandwidth multi-memory interconnect. Embodiments are useful for systems incorporating 3D die-stacked memories into advanced technology products, including those that implement Big Data applications, which are expected to increase memory demands, requiring high bandwidth and low-energy memory accesses.

Although embodiments have been described with respect to ring interconnection schemes for stacked memory devices, it should be noted that such embodiments can also be applied to other stacked devices, such as logic chips that can also be stacked, and other similar devices.

Any of the embodiments described herein may be used alone or together with one another in any combination. The one or more implementations encompassed within this specification may also include embodiments that are only partially mentioned or alluded to or are not mentioned or alluded to at all in this description or in the abstract. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

For purposes of the present description, the terms "component," "module," "circuit," and "process," may be used interchangeably to refer to a circuit element or processing unit that performs a particular function. Such a function may be implemented purely in hardware or it may be implemented through computer program code (software), digital or analog circuitry, computer firmware, or any combination thereof.

It should be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, physical (non-transitory), non-volatile storage media in various forms, such as optical, magnetic or semiconductor storage media. Under some embodiments, the computer readable media may store program code or software instructions that are executed by a computer system and cause the computer system to perform at least some of the functions and processes of a method described herein.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A system comprising:
    a first three-dimensional integrated circuit device having a first plurality of die layers arranged in a stacked die configuration;
    a first set of ring networks, wherein each ring network of the first set of ring networks is disposed within one of the first plurality of die layers and a second set of ring networks disposed between die layers of the first plurality of die layers;
    a second three-dimensional integrated circuit device having a second plurality of die layers arranged in a stacked die configuration; and
    a third set of ring networks coupling at least one of the first or second set of ring networks to at least one of the second plurality of die layers.

2. The system of claim 1 wherein the second three-dimensional integrated circuit comprises respective sets of ring networks disposed within and between each layer of the second plurality of die layers.

3. The system of claim 1 wherein separate die layers of the first plurality of die layers and the second plurality of die layers are connected to one another within each respective integrated circuit device through one of: through-silicon vias, capacitive coupling, and conductive links.

4. The system of claim 3 wherein each of the first, second and third set of ring networks utilizes a same ring-based data transmission protocol.

5. The system of claim 4 wherein the transmission protocol comprises one of: a token ring protocol, a token packet protocol, or a proprietary protocol.

6. The system of claim 1 wherein the first three-dimensional integrated circuit device and second three-dimensional integrated circuit device both comprise stacked memory devices.

7. The system of claim 6 wherein the stacked memory device comprises one of a high-bandwidth device and a WideIO device.

8. The system of claim 1 wherein at least one of the first and second sets of ring networks comprises pairs of rings transmitting data in opposite directions.

9. The system of claim 1 further comprising a set of inter-die bridge routers coupling at least one of the first set of ring networks to at least one of the second set of ring networks.

10. The system of claim 9 further comprising a set of inter-device bridge routers coupling at least one ring network of the first set or second set of ring networks to at least one ring network of the second three-dimensional integrated through at least one ring network of the third set of ring networks.

11. A system comprising:
    a first stacked die integrated circuit (IC) having multiple die layers and an intra-layer ring network arranged horizontally on a layer and an inter-layer ring network arranged vertically between at least two of the die layers;
    a second stacked die IC having multiple die layers and a respective intra-layer ring network arranged horizontally on a layer of the second stacked die IC and a respective inter-layer ring network arranged vertically between at least two die layers of the second stacked die IC; and
    a transmission link coupling at least one ring network of the first stacked die IC to at least one respective ring network of the second stacked die IC to form an inter-device ring network.

12. The system of claim 11 wherein each of the at least one ring network of the first stacked die IC and the at least one respective ring network of the second stacked die IC, and the inter-device ring network employs the same data transmission protocol.

13. The system of claim 12 wherein the transmission protocol comprises one of: a token ring protocol, a token packet protocol, or a proprietary protocol.

14. The system of claim 13 wherein separate die layers of the first stacked die IC and second stacked die IC are connected to one another within each respective integrated circuit device through one of: through-silicon vias, capacitive coupling, and conductive links.

15. A method of interconnecting nodes among three-dimensional integrated circuits (IC), comprising:
    providing a set of horizontal ring networks along respective die layers of each three-dimensional IC;
    providing a set of vertical ring networks between die layers of each three-dimensional IC; and providing at least one system ring network coupling a horizontal ring network of the set of horizontal ring networks to a vertical ring network of the set of vertical ring networks.

16. The method of claim 15, wherein each node of the interconnected nodes comprises a router configured to pass network traffic among the three-dimensional ICs.

17. The method of claim 16 wherein the network traffic is transmitted according to a transmission protocol comprising one of: a token ring protocol, a token packet protocol, or a proprietary protocol.

18. The method of claim 17 wherein the three-dimensional ICs comprise one of high-bandwidth devices and WideIO devices, and wherein the nodes comprise memory locations within respective ICs.

19. The method of claim 18 further comprising providing an interface to facilitate definition and reconfiguration of the horizontal and vertical ring networks through one or more software routines.

20. The method of claim 16 further comprising providing a bridge router component within the at least one system ring network to transmit network traffic between at least one of the set of horizontal ring networks and at least one of the set of vertical ring networks.

* * * * *